United States Patent
Mitchell et al.

(10) Patent No.: US 8,059,338 B2
(45) Date of Patent: Nov. 15, 2011

(54) METHOD AND APPARATUS FOR COATING A CURVED SURFACE

(75) Inventors: Daniel B. Mitchell, Port McNicoll (CA); Geoffrey G. Harris, Midland (CA); Douglas J. Brown, Midland (CA)

(73) Assignee: Raytheon Company, Waltham, MA (US)

( * ) Notice: Subject to any disclaimer, the term of this patent is extended or adjusted under 35 U.S.C. 154(b) by 569 days.

(21) Appl. No.: 12/178,505

(22) Filed: Jul. 23, 2008

(65) Prior Publication Data

US 2010/0020426 A1   Jan. 28, 2010

(51) Int. Cl.
*G02B 1/10* (2006.01)
*B05D 3/06* (2006.01)

(52) U.S. Cl. ........................ 359/581; 427/566
(58) Field of Classification Search .................. 359/580, 359/581, 586, 587, 588, 589; 427/566
See application file for complete search history.

(56) References Cited

U.S. PATENT DOCUMENTS 5,728,456 A * 3/1998 Adair et al. .................... 428/216
6,768,581 B1 * 7/2004 Yip et al. ....................... 359/355
* cited by examiner

*Primary Examiner* — Alessandro Amari
(74) *Attorney, Agent, or Firm* — Haynes and Boone, LLP

(57) ABSTRACT

A method involves: determining a percentage by which a thickness of a layer of material, if applied by a selected coating apparatus to a curved surface on a selected optical component having an operating wavelength, would decrease from a central region of the curved surface to an edge region of the curved surface; formulating a multi-layer optical coating that will provide, in the central region of the curved surface, a specified optical performance characteristic for all radiation within a waveband extending from the operating wavelength to a further wavelength, where the further wavelength decreased by the percentage equals the operating wavelength; and using the selected coating apparatus to form the multi-layer optical coating on the curved surface.

13 Claims, 4 Drawing Sheets

METHOD AND APPARATUS FOR COATING A CURVED SURFACE

FIELD OF THE INVENTION

This invention relates in general to techniques for coating surfaces and, more particularly, to techniques for coating curved surfaces.

BACKGROUND

When fabricating optical components such as lenses, it is very common to form a coating on a surface of the component, where the coating provides desired optical or physical properties. For example, the coating may provide an antireflective (AR) characteristic, a filtering characteristic, physical protection for the component, some other characteristic, or a combination of two or more characteristics. These coatings often include multiple layers of different materials that collectively provide the desired characteristic(s).

One problem with conventional coating techniques is that any given layer in the coating may have a thickness that is not uniform throughout the layer. For example, where a coating is formed on a relatively highly curved surface, it is common for a given layer within the coating to have a peripheral region that is as much as 30% to 50% thinner than a central region of that layer, or even more than 50% thinner. Further, different layers in the same coating often have different variations in thickness. For example, one layer may be 30% thinner in a peripheral region than in a central region, while another layer may be 50% thinner in the peripheral region than in the central region. Consequently, the ratios of thicknesses of different layers in the peripheral region can be different from the ratios of thicknesses of those same layers in the central region.

Thus, even assuming that the layers of a coating all have the proper thicknesses or proper ratios of thicknesses in the central region, the thicknesses in the peripheral region will typically not be correct and, moreover, the ratios of thicknesses in the peripheral region will typically not be correct. As a result, the coating should provide the desired characteristics in its central region, but may fail to provide the desired characteristics in its peripheral region, or may at least exhibit a degradation of the desired characteristics in the peripheral region.

BRIEF DESCRIPTION OF THE DRAWINGS

A better understanding of the present invention will be realized from the detailed description that follows, taken in conjunction with the accompanying drawings, in which.

DETAILED DESCRIPTION

Figure 1:
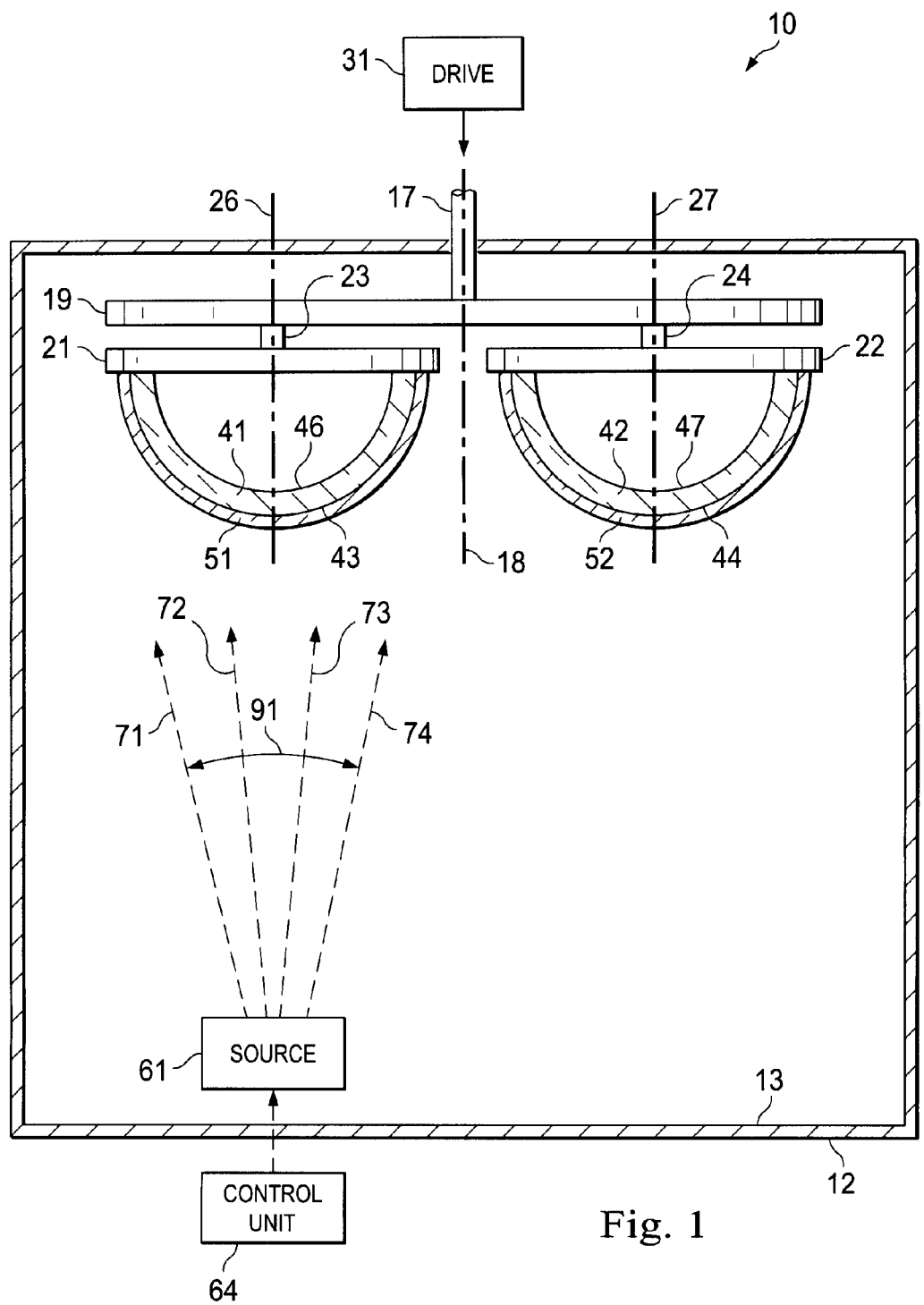
FIG. 1 is a diagrammatic sectional side view of a coating apparatus that involves aspects of the invention.

FIG. 1 is a diagrammatic sectional side view of a coating apparatus 10. The coating apparatus 10 includes a housing 12 with a chamber 13 therein. During a typical coating operation, a vacuum is maintained in the chamber 13 by a not-illustrated vacuum pump. The housing 12 supports a primary axle 17 for rotation about a primary vertical axis 18. A disk-shaped support part 19 is supported on the axle 17 for rotation with the axle about the axis 18.

The support part 19 rotatably supports two disk-shaped workpiece support members 21 and 22. More specifically, two additional vertical axles 23 and 24 are rotatably supported on the support part 19. These additional axles are spaced circumferentially from each other about the primary axle 17, and each rotate about a respective additional vertical axis 26 or 27. The two support members 21 and 22 are each supported on a respective one of the axles 23 and 24 for rotation therewith about the associated axis 26 or 27. Although FIG. 1 shows two additional axles 23 and 24 and two workpiece support members 21 and 22, it would alternatively be possible to have one or more further workpiece support members that each have an additional axle, where all the additional axles are spaced circumferentially from each other about the primary axle 17.

A drive mechanism 31 such as an electric motor is coupled to the axle 17, in order to effect rotation of the axle 17 and the support part 19. A not-illustrated planetary gearing mechanism of a well-known type is provided and, in response to rotation of the support part 19 with respect to the housing 12, effects rotation of the additional axles 23 and 24 with respect to the support part 19. Thus, the workpiece support members 21 and 22 each undergo planetary movement about the primary axis 18 with respect to the housing 12. The primary axle 17, the support part 19, the additional axles 23 and 24, and the workpiece support members 21 and 22 collectively serve as a workpiece support mechanism.

Each of the workpiece support members 21 and 22 is configured to removably support a respective workpiece 41 or 42. The workpieces 41 and 42 each have a convex curved surface 43 or 44 on a lower side thereof, and a concave curved surface 46 or 47 on the upper side thereof. The apparatus 10 is used to form respective coatings 51 and 52 on the respective curved surfaces 43 and 44 of the workpieces 41 and 42, in a manner discussed in more detail later. The coating apparatus 10 is not limited to use for coating highly curved surfaces, and can be used to coat surfaces having other shapes. As one example, the workpieces 41 and 42 in FIG. 1 could each be inverted, and the concave surfaces 46 and 47 could be coated. The workpieces 41 and 42 in the disclosed embodiment, considered without the coatings 51 and 52, are each an optical component of a type well known in the art, such as a lens. However, the coating apparatus 10 is not limited to use for coating optical components, but instead can alternatively be used for coating a wide variety of other types of workpieces.

It would be possible for each of the coatings 51 and 52 to be only a single layer of a single material. But in the disclosed embodiment, the coatings 51 and 52 each include a plurality of different layers, involving the use of one material for some layers, another material for other layers, and so forth. By interleaving different layers of different materials, the coatings 51 and 52 can each be given certain desired optical characteristics. For example, the coatings 51 and 52 may each be antireflective (AR) coatings that provide little or no reflection of a selected range of wavelengths, such as a range corresponding to visible light.

In some cases, the multi-layer coatings 51 and 52 will be configured to provide a combination of two or more desired optical characteristics. For example, a given coating may provide an AR characteristic as to one range of wavelengths, such as visible light, while also filtering out wavelengths in a different range, such as a range associated with laser energy. As another example, if the optical workpiece 41 or 42 happens to be made of a relatively soft material that was selected because it provides certain desirable optical properties, the coating 51 or 52 thereon may be configured to be physically harder than the associated workpiece 41 or 42, in order to help physically protect the material of the workpiece 41 or 42. Thus, a given coating 51 may provide an AR characteristic, while also being physically harder than the material of the workpiece 41 or 42, in order to help physically protect the workpiece. The discussion here of AR characteristics, filtering characteristics and hardness characteristics is merely exemplary. The coatings 51 and 52 may each provide some or all of these characteristics, and/or any of a variety of other characteristics, separately or in combination.

The coating apparatus 10 includes a source 61 within the housing 12, in a lower portion of the chamber 13. The source 61 is spaced downwardly from the support part 19. The source 61 and the drive mechanism 31 are both controlled by a control unit 64 of a known type, which is shown diagrammatically. Although FIG. 1 shows only a single source 61, it would alternatively be possible to provide two or more sources in the apparatus 10. In the disclosed embodiment, the source 61 is spaced radially from the primary axis 18, and is positioned approximately below the path of travel of the workpiece support members 21 and 22. However, it would alternatively be possible for the source 61 to be positioned at any of a variety of other locations within the housing 12.

The source 61 is a device of a type well known in the art, and is therefore described here only briefly. More specifically, in the disclosed embodiment, the source 61 is a type of device commonly referred to as an electron beam evaporator. However, the source 61 could alternatively be any other suitable type of device. The source 61 contains two or more different materials that will be used to form respective layers in each of the multi-layer coatings 51 and 52, and the source can selectively evaporate any of these different materials. At any given point in time, the source 61 will typically be evaporating only one of the multiple materials that it contains. But in some situations, the source may simultaneously evaporate two or more of these different materials.

When the source 61 is evaporating a material, a plume of the evaporated material travels upwardly, as indicated diagrammatically by arrows 71-74. The plume 71-74 has a dispersion angle 91. The plume 71-74 from the source 61 forms a layer of the coatings 51 and 52 as the workpieces 41 and 42 pass above the source 61.

It is possible that the layers in each of the multi-layer coatings 51 and 52 could all have the same thicknesses. Typically, however, some layers will intentionally be thicker than other layers. Ideally, it is desirable that the thickness of each layer be relatively uniform throughout that layer. But as a practical matter, that is not always possible. More specifically, when one of the workpieces 41 and 42 is passing over the source 61, and due to the significant curvature of the surface 43 or 44 thereon, the plume 71-74 will impinge on the central region of the curved surface approximately perpendicular thereto, but will impinge on the peripheral or edge regions of the curved surface at a relatively steep angle. As a result, each layer of the resulting coating will tend to be thicker in the central region that in the edge regions.

Different layers made of different materials may experience different degrees of variation in thickness. For example, a layer made of one material may have an edge region that is 35% thinner than its central region, whereas a different layer made of a different material may have an edge region that is 45% thinner than its central region. Since most or all layers in the coating 51 or 52 will be thinner in the edge region than in the central region, the coating 51 or 52 will have an overall thickness in the edge region that is thinner than the overall thickness in the central region. It is common for a coating to be 30% to 50% thinner in the edge region than in the central region. Where the workpiece is an optical component, this variation in coating thickness can affect the optical performance of the resulting component.

For example, assume hypothetically that a not-illustrated conventional optical component has a curved surface with a multi-layer coating thereon, and that the coating is intended to pass radiation from a laser with a wavelength of 1064 nm. More specifically, assume that the coating is configured to efficiently pass radiation within a waveband of 1040 nm to 1090 nm (where 1064 nm is approximately in the center of this waveband), that the coating has the proper thickness in its central region, and that the coating is about 35% thinner in its edge region than in its central region. Since the thickness changes by 35%, the effective operating wavelength will also change by about 35%. Consequently, while the central region will operate as intended and efficiently pass radiation in the intended waveband of 1040 nm to 1090 nm (which includes the operating wavelength of 1064 nm), the edge region will have an effective waveband that is about 35% different, for example about 676 nm to 709 nm. It should be noted that the waveband of 676 nm to 709 nm does not include the intended operating wavelength of 1064 nm. Consequently, the edge region will not operate as intended, in that it will not efficiently pass radiation within the intended waveband of 1040 nm to 1090 nm, and thus will not efficiently pass laser light at the intended operating wavelength of 1064 nm.

In contrast, in the embodiment of FIG. 1, the coating 51 is configured so as to ensure that it will efficiently handle radiation at the operating wavelength, despite variations in thickness resulting from the coating process. For example, assume that one design specification is that all regions of the coating 51 must pass 95% of radiation having an operating wavelength of 1064 nm, which may for example be laser light.

Figure 2:
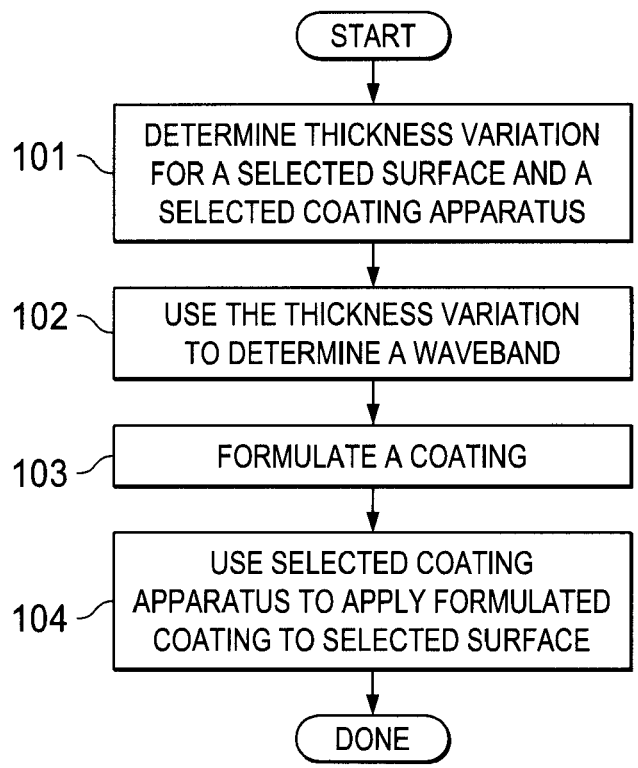
FIG. 2 is a flowchart showing a procedure for configuring a coating that is shown in FIG. 1 so the coating will meet a design specification.

FIG. 2 is a flowchart showing a procedure for configuring the coating 51 so that it will meet this design specification. In block 101, the component with the surface to be coated is selected. Stated differently, the surface to be coated is selected. Then, the coating apparatus that will be used to form the surface is selected. Next, some tests are carried out, using the selected coating apparatus with some samples of the selected surface, in order to form one or more layers of typical coating materials, such as silicon (Si), or silicon monoxide (SiO). The test coating is examined in order to determine how much the coating thickness varies for the geometry of the selected surface, when coated by the selected coating apparatus.

Alternatively, the percentage variation could be determined from a single layer of a typical coating material. As still another alternative, for each of several typical coating materials, a percentage variation could be determined for a single layer of that material. Then, from this group of percentages, the largest percentage could be selected for subsequent use in the procedure of FIG. 2. As yet another alternative, it would be possible to determine the mean or simple average of the percentages in the group. As still another alternative, it would be possible to calculate a weighted average of the percentages in the group. For example, the term "optical thickness" means the physical thickness of a given layer of material multiplied by the refractive index of that material. For each of the separate test layers that were used to obtain the group of percentages, the measured percentage for that layer could be multiplied by the optical thickness of the layer in order to obtain a value. The values would be summed, and then the sum would be is divided by the total number of test layers, in order to obtain the weighted average. Assume for the sake of discussion that, whichever of these different approaches is utilized, the percentage ultimately measured or calculated by that approach is 40%.

In block 102, the percentage identified in block 101 is used to determine a suitable waveband. In the hypothetical example under discussion, the identified percentage is 40%, and the design specification is that the coating 51 must pass 95% of radiation having an operating wavelength of 1064 nm. This means that the coating must be configured so that it transmits 95% of light from 1064 nm to 1774 nm (where 1774 nm decreased by 40% is 1064 nm).

In the foregoing discussion of block 102, the determination of an appropriate waveband was explained in relation to a component having an operating wavelength. However, it is alternatively possible to determine, in a similar manner, an appropriate waveband for a component having an operating waveband. More specifically, assume that an optical component has an operating waveband that extends from a first wavelength to a second wavelength greater than the first wavelength. The appropriate waveband would then be determined to extend from the first wavelength to a wavelength that is the second wavelength increased by the percentage.

In block 103, a multi-layer coating is formulated that will transmit 95% of light within this waveband of 1064 nm to 1774 nm. Persons skilled in the art are familiar with how to formulate multi-layer coatings that will meet specified design constraint, and the specific steps involved in formulating the coating are therefore not described here in detail. The configuration of the coating will be a function of several factors, including the shape of the selected surface that is being coated, the particular coating apparatus selected to form the coating, a wavelength or waveband of interest, the specified performance requirement for that wavelength or waveband, and so forth. Thereafter, in block 104, the coating is formed on the selected surface, using the selected coating apparatus.

Figure 3:
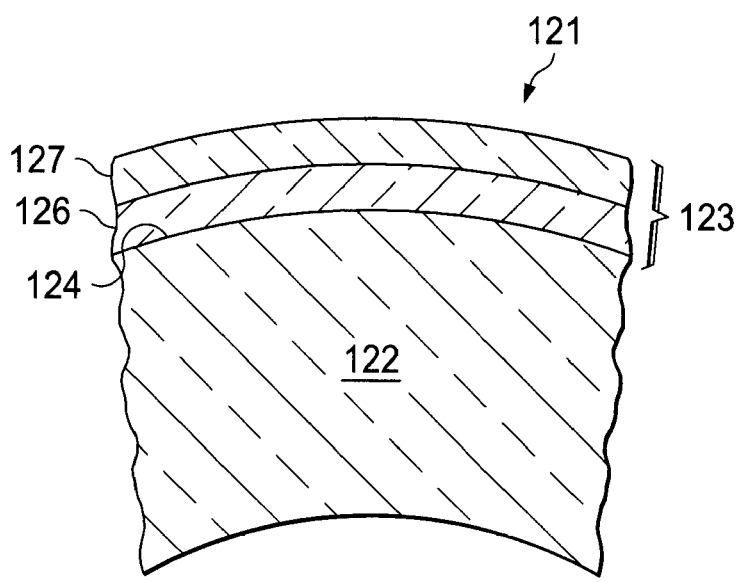
FIG. 3 is a diagrammatic fragmentary sectional side view of part of an optical component with a conventional antireflection coating thereon.

As another example, FIG. 3 is a diagrammatic fragmentary sectional side view of part of a conventional optical component 121 that is intended to pass radiation with a wavelength of 3.4 μm. The component 121 includes a substrate 122 such as a lens or dome. The substrate 121 is made of zinc selenide (ZnSe), and has a curved surface 124 with an AR coating 123 thereon. The curved surface 124 has a radius of 4 inches and, in a front view, has a diameter of about 6 inches. The coating 123 includes a first layer 126 that is provided on the surface 124, that is made of silicon (Si), and that has a thickness of 0.289 μm in the center of the coating. The coating 123 also includes a second layer 127 that is provided on the first layer 126, that is made of silicon monoxide (SiO), and that has a thickness of 0.928 μm in the center of the coating In its peripheral regions, the coating 123 is about 30% thinner than in its central region.

Figure 4:
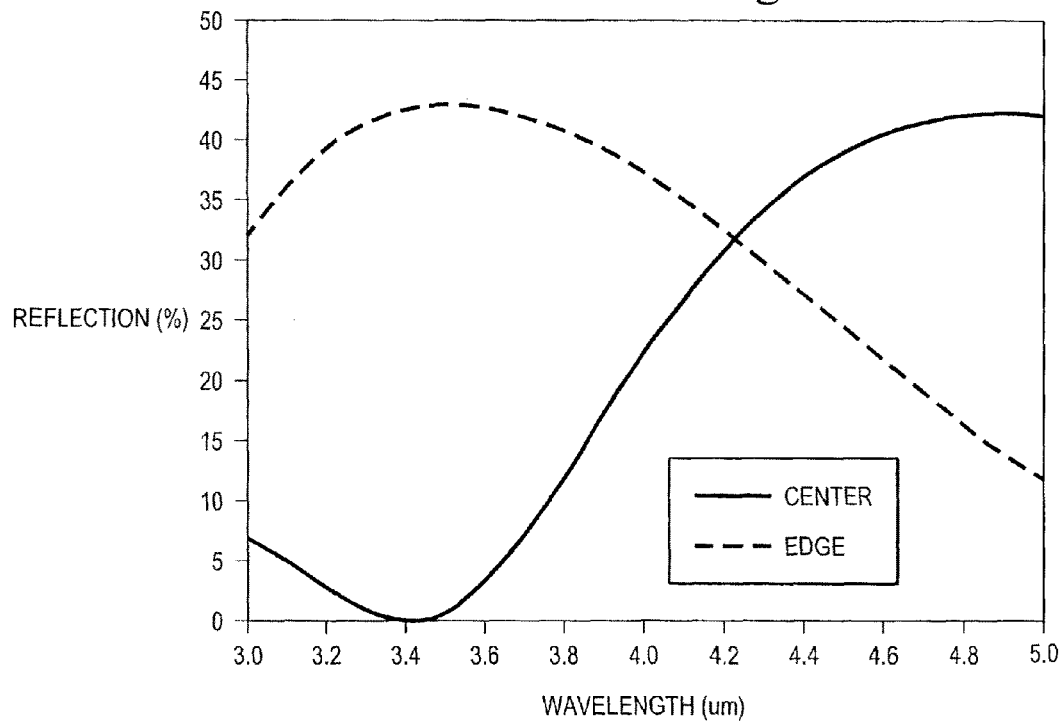
FIG. 4 is a graph showing the performance of the antireflection coating of FIG. 3, where the horizontal axis represents wavelength, and the vertical axis represents percentage of reflection.

FIG. 4 is a graph showing the performance of the AR coating 123, where the horizontal axis represents wavelength, and the vertical axis represents the percentage of radiation reflected by the coating. The solid-line curve represents the optical performance in a central region of the coating. It will be noted that, for the operating wavelength of 3.4 μm, the reflectivity is 0%, or in other words the transmissivity is 100%. In contrast, the broken-line curve in FIG. 4 represents the performance of the AR coating 123 at its edge regions. It will be noted that, in the edge regions, the AR coating 123 is not very effective at avoiding reflections, because it reflects approximately 42% of radiation at the operating wavelength of 3.4 μm. If the surface 124 on the ZnSe substrate 122 had no coating at all, it would reflect only about 17% of the radiation at 3.4 μm. Thus, in its edge regions, the coating 123 does more harm than good.

Figure 5:
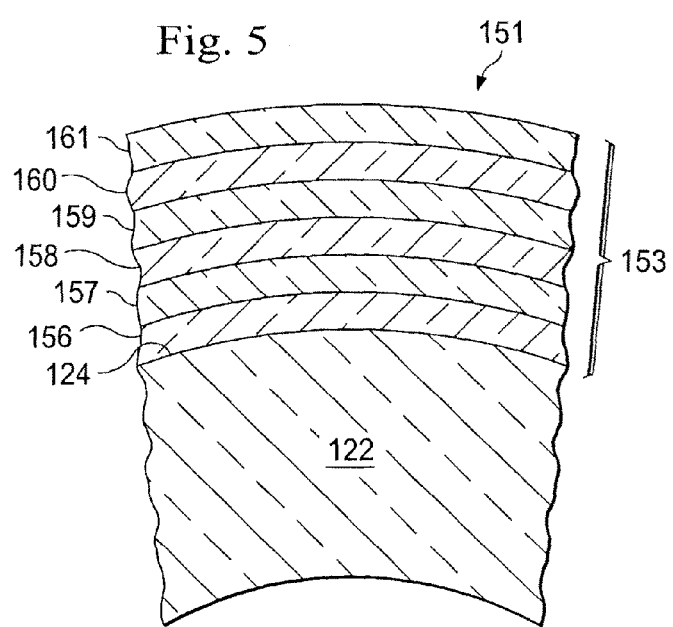
FIG. 5 is a diagrammatic fragmentary sectional side view similar to FIG. 3, but showing an optical component that is a different version of the component shown in FIG. 3.

FIG. 5 is a diagrammatic fragmentary sectional side view of an optical component 151. The optical component 151 includes the same ZnSe substrate 122 that was shown in FIG. 3, with the same surface 124 thereon. However, the optical component 151 has a different AR coating 153 that was formulated using the approach shown in the flowchart of FIG. 2. More specifically, the coating 153 includes six layers 156-161. The layer 156 is provided on the surface 124, is made of silicon (Si), and is 0.048 μm thick in the central region of the coating. The layer 157 is provided on the layer 156, is made of silicon monoxide (SiO), and is 0.108 μm thick in the central region of the coating. The layer 158 is provided on the layer 157, is made of silicon (Si) and is 0.193 μm thick in the central region of the coating. The layer 159 is provided on the layer 158, is made of silicon monoxide (SiO), and is 0.017 μm thick in the central region of the coating. The layer 160 is provided on the layer 159, is made of silicon (Si), and is 0.232 μm thick in the central region of the coating. The layer 161 is provided on the layer 160, is made of silicon monoxide (SiO) and is 0.395 μm thick in the central region of the coating.

Figure 6:
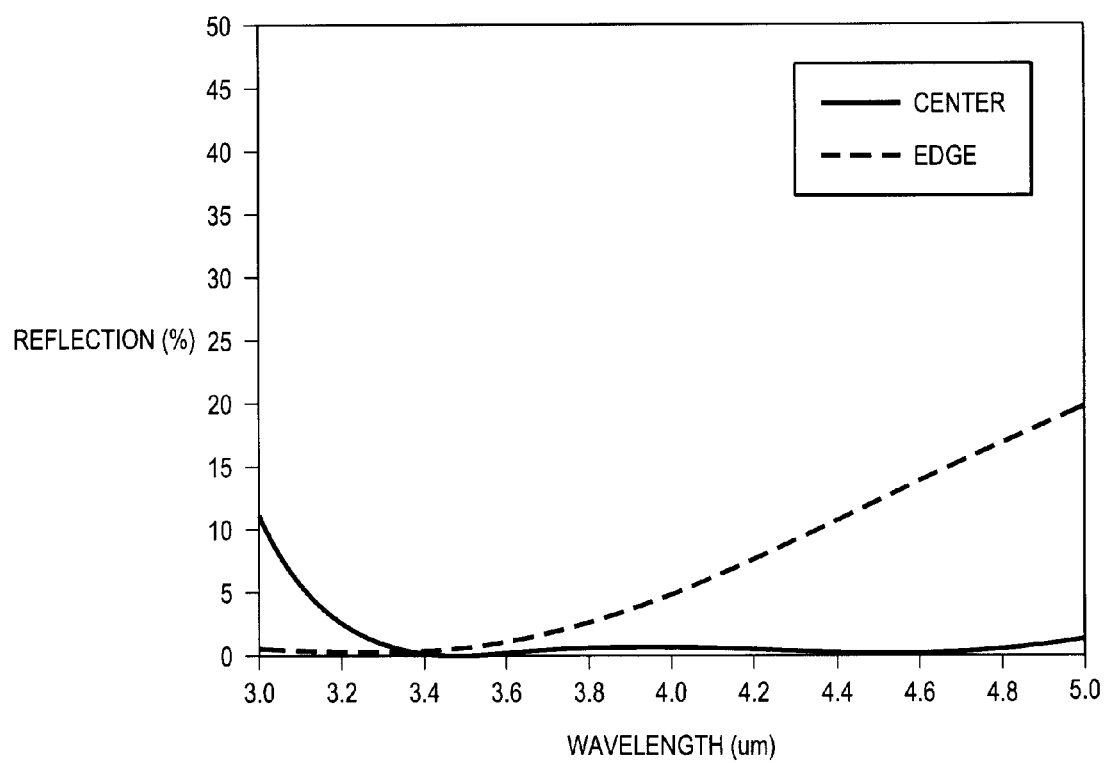
FIG. 6 is a graph similar to FIG. 4, but showing the performance of the antireflective coating of FIG. 5.

FIG. 6 is a graph similar to FIG. 4, but showing the performance of the AR coating 153 of FIG. 5. The solid-line curve and the broken-line curve show that, for radiation at the operating wavelength of 3.4 μm, the central and edge regions of the coating 153 each have a reflectivity less than 1%, or in other words a transmissivity greater than 99%. In other words, the coating 153 is highly effective across the full surface 124 of the optical component.

Although selected embodiments have been illustrated and described in detail, it should be understood that a variety of substitutions and alterations are possible without departing from the spirit and scope of the present invention, as defined by the claims that follow.

What is claimed is:

1. A method comprising:
determining a percentage that is a function of the amount by which a thickness of a layer of material, if applied by a selected coating apparatus to a curved surface on a selected optical component having an operating wavelength, would decrease from a central region of said curved surface to an edge region of said curved surface;
determining, using said percentage, a waveband that extends from said operating wavelength to a further wavelength, where said further wavelength decreased by said percentage equals said operating wavelength;
formulating, using said waveband, a multi-layer optical coating that will provide, in said central region of said curved surface, a specified optical performance characteristic for all radiation within said waveband; and
using the selected coating apparatus to form said multi-layer optical coating on said curved surface.

2. A method according to claim 1,
wherein said optical component has an operating waveband that extends from a first wavelength to a second wavelength greater than said first wavelength, and that includes said operating wavelength;

wherein said determining includes determining, using said percentage, a waveband that extends from said first wavelength to a wavelength that, decreased by said percentage, equals said second wavelength; and wherein said formulating is carried out so that said multi-layer coating provides, in said central region of said curved surface, said specified optical performance for all radiation within said waveband that extends from said first wavelength to said wavelength that, decreased by said percentage, equals said second wavelength.

3. A method according to claim 1, wherein said coating includes a plurality of different materials; and wherein the material involved in said determining is one of the materials in said coating.

4. A method according to claim 1, wherein said determining includes:

measuring for each of a plurality of different materials the amount by which a thickness of a layer of that material, if applied by said selected coating apparatus to said curved surface on said selected optical component, would decrease from a central region of said curved surface to an edge region of said curved surface; and carrying out one of: selecting the largest said amount of decrease as said percentage, calculating as said percentage a mean value that is a function of each of said amounts of decrease, and calculating as said percentage an average value that is a function of each of said amounts of decrease.

5. A method comprising:

determining a percentage that is a function of the amount by which a thickness of a layer of material, if applied by a selected coating apparatus to a curved surface on a selected optical component having an operating wavelength, would decrease from a central region of said curved surface to an edge region of said curved surface;

formulating a multi-layer optical coating that will provide, in said central region of said curved surface, a specified optical performance characteristic for all radiation within a waveband extending from said operating wavelength to a further wavelength, where said further wavelength decreased by said percentage equals said operating wavelength; and using the selected coating apparatus to form said multi-layer optical coating on said curved surface;

wherein said determining includes:

measuring for each of a plurality of different materials the amount by which a thickness of a layer of that material, if applied by said selected coating apparatus to said curved surface on said selected optical component, would decrease from a central region of said curved surface to an edge region of said curved surface; and carrying out one of: selecting the largest said amount of decrease as said percentage, calculating as said percentage a mean value that is a function of each of said amounts of decrease, and calculating as said percentage an average value that is a function of each of said amounts of decrease; and wherein said calculating of said average value is carried out in a manner so that said average value is a weighted average of said amounts of decrease.

6. A method according to claim 1, wherein said using of said selected coating apparatus to form said coating includes effecting evaporation within said selected coating apparatus of each of said plurality of different materials in said coating.

7. A method according to claim 1, wherein said using of said selected coating apparatus to form said coating includes effecting electron beam evaporation within said selected coating apparatus of each of said plurality of different materials in said coating.

8. A method according to claim 1, including selecting as said performance characteristic a transmission characteristic of said coating.

9. An apparatus comprising:

an optical component having a curved surface with a central region and an edge region;

a multi-layer optical coating provided on said curved surface, said coating providing in said central region a specified optical performance characteristic for all radiation within a waveband extending from an operating wavelength of the selected optical component to a further wavelength, where said further wavelength decreased by a percentage equals said operating wavelength, and said percentage being a function of an amount by which the thickness of a selected layer in said coating decreases from said central region to said edge region.

10. An apparatus according to claim 9, wherein said optical component has an operating waveband that extends from a first wavelength to a second wavelength greater than said first wavelength, and that includes said operating wavelength; and wherein said multi-layer coating provides, in said central region of said curved surface, said specified optical performance for all radiation within a waveband that extends from said first wavelength to a wavelength that, decreased by said percentage, equals said second wavelength.

11. An apparatus according to claim 9, wherein said coating includes a plurality of different materials.

12. An apparatus according to claim 11, wherein said selected layer of said coating is the layer thereof having the largest decrease in thickness from said central region to said edge region.

13. An apparatus according to claim 9, wherein said performance characteristic is a transmission characteristic.

\* \* \* \* \*